(12) United States Patent
Chien et al.

(10) Patent No.: US 9,214,579 B2
(45) Date of Patent: Dec. 15, 2015

(54) ELECTRICAL CONTACT STRUCTURE WITH A REDISTRIBUTION LAYER CONNECTED TO A STUD

(71) Applicant: XINTEC INC., Zhongli, Taoyuan County (TW)

(72) Inventors: Wei-Ming Chien, Yangmei (TW); Po-Han Lee, Taipei (TW); Tsang-Yu Liu, Zhubei (TW); Yen-Shih Ho, Kaohsiung (TW)

(73) Assignee: XINTEC INC., Taoyuan (TW)

( * ) Notice: Subject to any disclaimer, the term of this patent is extended or adjusted under 35 U.S.C. 154(b) by 0 days.

(21) Appl. No.: 14/534,684

(22) Filed: Nov. 6, 2014

(65) Prior Publication Data

US 2015/0123231 A1    May 7, 2015

Related U.S. Application Data

(60) Provisional application No. 61/901,276, filed on Nov. 7, 2013.

(51) Int. Cl.
| | |
|---|---|
| *H01L 31/0232* | (2014.01) |
| *H01L 31/02* | (2006.01) |
| *H01L 31/18* | (2006.01) |
| *H01L 31/0236* | (2006.01) |

(52) U.S. Cl.
CPC .... *H01L 31/02327* (2013.01); *H01L 31/02002* (2013.01); *H01L 31/02363* (2013.01); *H01L 31/1804* (2013.01)

(58) Field of Classification Search
CPC ................ H01L 31/02327; H01L 31/02002; H01L 31/1804; H01L 31/02363

USPC ........................................... 257/432; 438/404
See application file for complete search history.

(56) References Cited

U.S. PATENT DOCUMENTS

| | | | | |
|---|---|---|---|---|
| 6,656,828 | B1* | 12/2003 | Maitani | H01L 21/76843 257/E21.508 |
| 2010/0187557 | A1* | 7/2010 | Samoilov et al. | 257/99 |
| 2011/0233770 | A1* | 9/2011 | Chiu | H01L 31/0232 257/737 |
| 2012/0146214 | A1* | 6/2012 | Soltan | 257/737 |
| 2012/0187515 | A1* | 7/2012 | Kerness et al. | 257/432 |
| 2012/0205799 | A1* | 8/2012 | Lin | 257/737 |
| 2013/0001621 | A1* | 1/2013 | Shiu et al. | 257/98 |
| 2013/0328147 | A1* | 12/2013 | Ho | H01L 31/02002 257/432 |

* cited by examiner

*Primary Examiner* — Peter Bradford
(74) *Attorney, Agent, or Firm* — Liu & Liu

(57) ABSTRACT

A manufacturing method of a semiconductor structure includes the following steps. A wafer structure having a silicon substrate and a protection layer is provided. An electrical pad on the protection layer is exposed through the concave region of the silicon substrate. An isolation layer is formed on the sidewall of the silicon substrate surrounding the concave region and a surface of the silicon substrate facing away from the protection layer. A redistribution layer is formed on the isolation layer and the electrical pad. A passivation layer is formed on the redistribution layer. The passivation layer is patterned to form a first opening therein. A first conductive layer is formed on the redistribution layer exposed through the first opening. A conductive structure is arranged in the first opening, such that the conductive structure is in electrical contact with the first conductive layer.

14 Claims, 11 Drawing Sheets

ELECTRICAL CONTACT STRUCTURE WITH A REDISTRIBUTION LAYER CONNECTED TO A STUD

RELATED APPLICATIONS

This application claims priority to U.S. provisional Application Ser. No. 61/901,276, filed Nov. 7, 2013, which is herein incorporated by reference.

BACKGROUND

1. Field of Invention

The present invention relates to a semiconductor structure and a manufacturing method of the semiconductor structure.

2. Description of Related Art

A conventional semiconductor structure may include a chip, an electrical pad, a dielectric layer (e.g., $SiO_2$), a redistribution layer (RDL), a conductive layer, a passivation layer, and a solder ball. In general, when the semiconductor structure is manufactured, the dielectric layer is used to cover a silicon substrate (i.e., a wafer) which is not divided yet to form plural chips, so as to protect electronic components (e.g., a light sensor) on the semiconductor structure. Thereafter, a photolithography process and an etching process may be used to remove the silicon substrate and the dielectric layer above the electrical pad that is in the dielectric layer, such that a through via is formed in the silicon substrate and the dielectric layer, and the electrical pad is exposed through the through via.

Subsequently, an isolation layer may be used to cover the surface of the silicon substrate facing away from the dielectric layer and the surface of the silicon substrate surrounding the through via. After forming the isolation layer, the redistribution layer and the conductive layer may be sequentially formed on the isolation layer and the electrical pad. After the conductive layer is formed, the passivation layer may cover the conductive layer, and an opening is formed in the passivation layer to dispose the solder ball.

However, since the conductive layer completely covers the redistribution layer, the material of the conductive layer (e.g., nickel and gold) is wasted. Moreover, after the solder ball is in electrical contact with the conductive layer, the fixity of the solder ball needs to be test by a lateral force (i.e., a shear force). Because the conductive layer completely covers the redistribution layer, when the solder ball receives the lateral force, corners of the redistribution layer and corners of the conductive layer are easily damaged, and thus the yield rate of the entire semiconductor structure is difficult to be improved.

SUMMARY

An aspect of the present invention is to provide a manufacturing method of a semiconductor structure.

According to an embodiment of the present invention, a manufacturing method of a semiconductor structure includes the following steps. (a) A wafer structure having a silicon substrate and a protection layer is provided. An electrical pad on the protection layer is exposed through the concave region of the silicon substrate. (b) An isolation layer is formed on the sidewall of the silicon substrate surrounding the concave region and the surface of the silicon substrate facing away from the protection layer. (c) A redistribution layer is formed on the isolation layer and the electrical pad. (d) A passivation layer is formed on the redistribution layer. (e) The passivation layer is patterned to form a first opening therein, such that the redistribution layer on the surface of the silicon substrate is exposed through the first opening. (f) A first conductive layer is formed on the redistribution layer exposed through the first opening. (g) A conductive structure is arranged in the first opening, such that the conductive structure is in electrical contact with the first conductive layer.

In one embodiment of the present invention, in step (e), the passivation layer is patterned to form a second opening therein, such that the redistribution layer on the electrical pad and the sidewall is exposed through the second opening.

In one embodiment of the present invention, in step (f), a second conductive layer is formed on the redistribution layer that is exposed through the second opening.

In one embodiment of the present invention, the first conductive layer in step (f) is formed by utilizing a chemical plating process.

In one embodiment of the present invention, the isolation layer in step (b) is formed by utilizing a chemical vapor deposition process.

In one embodiment of the present invention, the wafer structure has a light transmissive element and a supporting layer that is located between the light transmissive element and the protection layer. The manufacturing method of the semiconductor structure further includes cutting the passivation layer, the silicon substrate, the protection layer, the supporting layer, and the light transmissive element.

In one embodiment of the present invention, the manufacturing method of the semiconductor structure further includes forming a tooth structure in the silicon substrate, in which the height of the tooth structure is smaller than or equal to the height of the surface of the silicon substrate.

Another aspect of the present invention is to provide a semiconductor structure.

According to an embodiment of the present invention, a semiconductor structure includes a silicon substrate, a protection layer, an electrical pad, an isolation layer, a redistribution layer, a passivation layer, a first conductive layer, and a conductive structure. The silicon substrate has a light sensor and a concave region. The protection layer is located on the silicon substrate and covers the light sensor. The electrical pad is located on the protection layer and aligned with the concave region. The isolation layer is located on the sidewall of the silicon substrate surrounding the concave region and a surface of the silicon substrate facing away from the protection layer. The redistribution layer is located on the isolation layer and the electrical pad. The passivation layer is located on the redistribution layer and has a first opening. The first conductive layer is located on the redistribution layer that is exposed through the first opening. The conductive structure is located in the first opening and in electrical contact with the first conductive layer.

In one embodiment of the present invention, the passivation layer has a second opening, and the redistribution layer located on the electrical pad and the sidewall is exposed through the second opening.

In one embodiment of the present invention, the semiconductor structure further includes a second conductive layer. The second conductive layer is located on the redistribution layer that is exposed through the second opening.

In one embodiment of the present invention, the perpendicular height of the second conductive layer is smaller than the perpendicular height of the surface of the silicon substrate.

In one embodiment of the present invention, the diameter of the concave region is gradually increased toward the electrical pad, such that the sidewall of the silicon substrate is an oblique surface.

In one embodiment of the present invention, the isolation layer is made of a material including oxide or nitride.

In one embodiment of the present invention, the semiconductor structure further includes a light transmissive element and a supporting layer. The supporting layer is located between the light transmissive element and the protection layer.

In one embodiment of the present invention, the silicon substrate further includes a tooth structure. The tooth structure is located adjacent to the concave region, and the height of the tooth structure is smaller than or equal to the height of the surface of the silicon substrate. The top end of the tooth structure is cusp-shaped, round-shaped, or flat-shaped.

In one embodiment of the present invention, the conductive structure is a solder ball or a conductive protruding block.

In the aforementioned embodiments of the present invention, since the first conductive layer is only formed on the redistribution layer that is exposed through the first opening and does not completely cover redistribution layer, the material cost of the first conductive layer may be reduced. Moreover, when the conductive structure is located on the first conductive layer in the first opening, the conductive structure is in electrical contact with the first conductive layer. When the conductive structure receives a lateral force (i.e., a shear force) for testing its fixity, corners or edges of the redistribution layer and the first conductive layer are not easily damaged because the first conductive layer is only formed on the redistribution layer that is exposed through the first opening. As a result, the yield rate of the entire semiconductor structure can be improved.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiments, with reference made to the accompanying drawings as follows.

DETAILED DESCRIPTION

Figure 1:
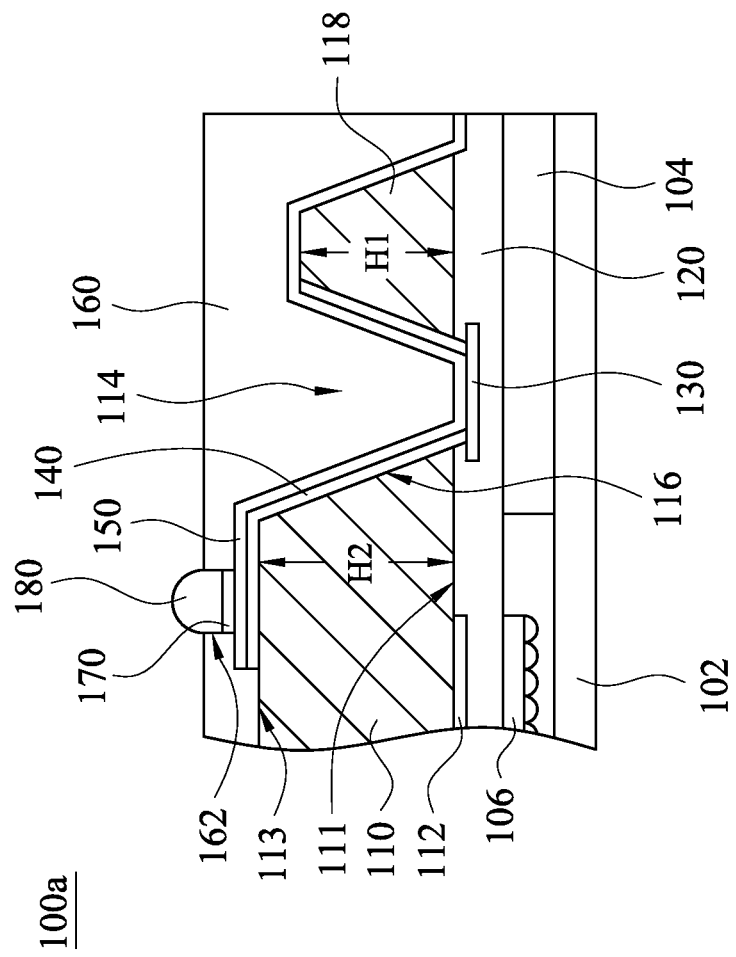
FIG. 1 is a cross-sectional view of a semiconductor structure according to one embodiment of the present invention.

Reference will now be made in detail to the present embodiments of the invention, examples of which are illustrated in the accompanying drawings. Wherever possible, the same reference numbers are used in the drawings and the description to refer to the same or like parts.

FIG. 1 is a cross-sectional view of a semiconductor structure 100a according to one embodiment of the present invention. As shown in FIG. 1, the semiconductor structure 100a includes a silicon substrate 110, a protection layer 120, an electrical pad 130, an isolation layer 140, a redistribution layer 150, a passivation layer 160, a first conductive layer 170, and a conductive structure 180. The silicon substrate 110 has a light sensor 112 and a concave region 114. The protection layer 120 is located on the surface 111 of the silicon substrate 110 and covers the light sensor 112, such that the light sensor 112 is protected by the protection layer 120. Moreover, the electrical pad 130 is located on the protection layer 120 and aligned with the concave region 114 of the silicon substrate 110. The isolation layer 140 is located on a sidewall 116 of the silicon substrate 110 surrounding the concave region 114 and a surface 113 of the silicon substrate 110 facing away from the protection layer 120. The redistribution layer 150 is located on the isolation layer 140 and the electrical pad 130. The passivation layer 160 is located on the redistribution layer 150 and has a first opening 162. The passivation layer 160 can prevent moisture and dust from entering the semiconductor structure 100a. The first conductive layer 170 is located on the redistribution layer 150 that is exposed through the first opening 162. The conductive structure 180 is located in the first opening 162 and in electrical contact with the first conductive layer 170.

Since the first conductive layer 170 is only formed on the redistribution layer 150 that is exposed through the first opening 162 and does not completely cover redistribution layer 150, the material cost of the first conductive layer 170 may be reduced. Moreover, when the conductive structure 180 is located on the first conductive layer 170 in the first opening 162, the conductive structure 180 is in electrical contact with the first conductive layer 170. When the conductive structure 180 receives a lateral force F (i.e., a shear force) for testing the fixity of the conductive structure 180, corners (edges) of the redistribution layer 150 and corners (or edges) of the first conductive layer 170 are not easily damaged because the first conductive layer 170 is only formed on the redistribution layer 150 that is exposed through the first opening 162. As a result, the yield rate of the entire semiconductor structure 100a can be improved.

In addition, the semiconductor structure 100a may further include a light transmissive element 102, a supporting layer 104, and a color filter 106. The supporting layer 104 is located between the light transmissive element 102 and the protection layer 120, such that the light transmissive element 102 is spaced from the protection layer 120 at a distance. The color filter 106 is disposed on a surface of the protection layer 120 facing away from the silicon substrate 110. The color filter 106 is aligned with the light sensor 112 of the silicon substrate 110. After light enters the light transmissive element 102, the light passes through the color filter 106 and is detected by the light sensor 112.

In this embodiment, the silicon substrate 110 may be an image sensing element, a MEMS (Microelectromechanical System) element, an operation processing element, etc. The silicon substrate 110 may be made of a material including silicon. The silicon substrate 110 may be one of chips that are formed by performing a cutting (dicing) process on a wafer. The protection layer 120 and the passivation layer 160 may be made of a material including silicon oxide, such as $SiO_2$. The isolation layer 140 may be made of a material including oxide or nitride. The electrical pad 130 may be made of a material including copper, the redistribution layer 150 may be made of a material including aluminum, and the first conductive layer 170 may be made of a material including nickel and gold. The conductive structure 180 may be a solder ball or a conductive protruding block. Moreover, the light transmissive element 102 may be a glass plate, and the supporting layer 104 may be made of a material including epoxy. However, the present invention is not limited to the aforesaid materials.

Moreover, the silicon substrate 110 may further include a tooth structure 118. The tooth structure 118 is located adjacent to the concave region 114, and the height H1 of the tooth structure 118 is smaller than or equal to the height H2 of the surface 113 of the silicon substrate 110 (i.e., the back surface of the silicon substrate 110). The top end of the tooth structure 118 may be cusp-shaped, round-shaped, or flat-shaped.

It is to be noted that the connection relationships of the elements described above will not be repeated in the following description. In the following description, a manufacturing method of the semiconductor structure 100a will be described.

Figure 2:
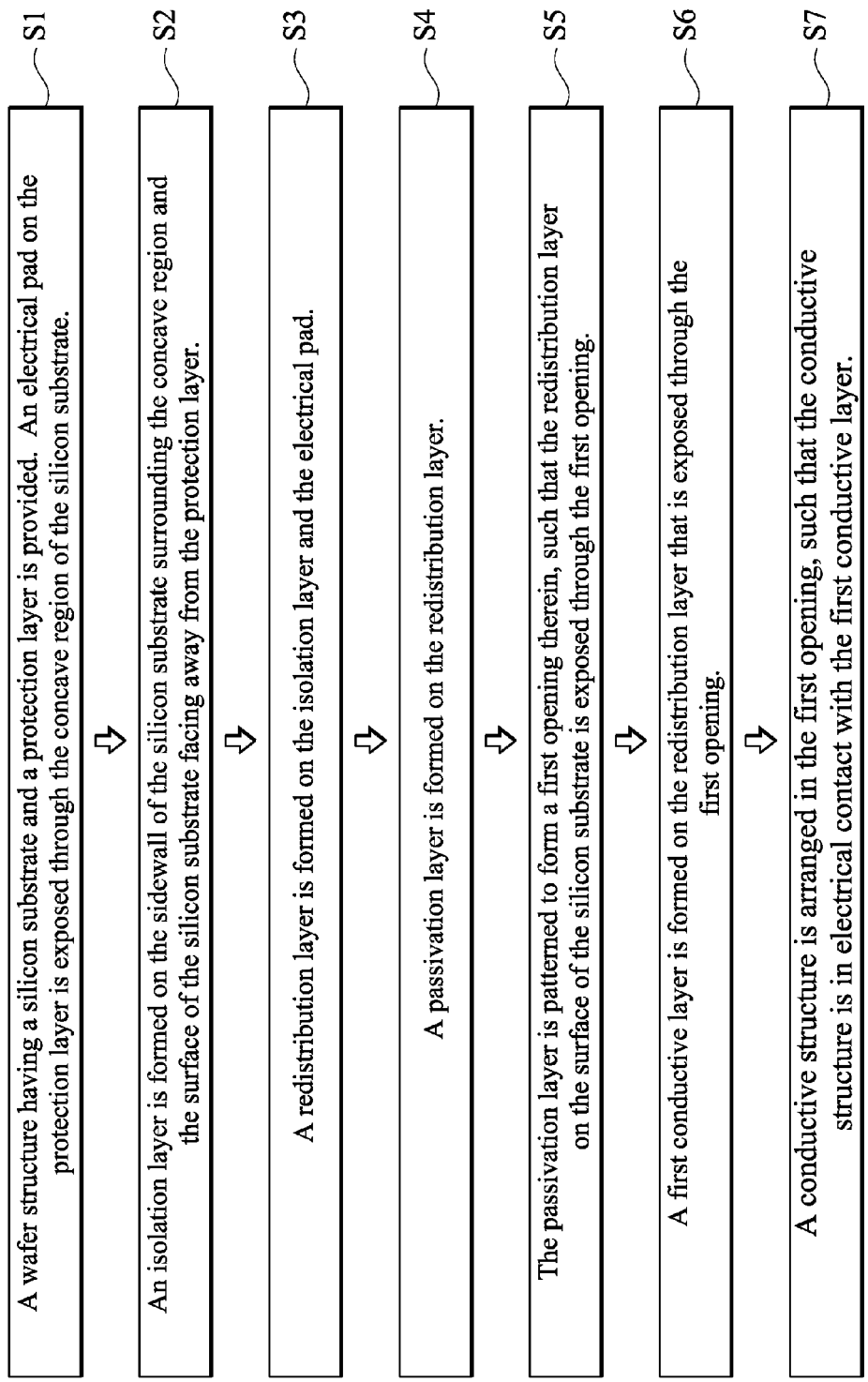
FIG. 2 is a flow chart of a manufacturing method of a semiconductor structure according to one embodiment of the present invention.

FIG. 2 is a flow chart of a manufacturing method of a semiconductor structure according to one embodiment of the present invention. In step S1, a wafer structure having a silicon substrate and a protection layer is provided. An electrical pad on the protection layer is exposed through the concave region of the silicon substrate. Thereafter, in step S2, an isolation layer is formed on the sidewall of the silicon substrate surrounding the concave region and the surface of the silicon substrate facing away from the protection layer. Next, in step S3, a redistribution layer is formed on the isolation layer and the electrical pad. Then, in step S4, a passivation layer is formed on the redistribution layer. Thereafter, in step S5, the passivation layer is patterned to form a first opening therein, such that the redistribution layer located on the surface of the silicon substrate is exposed through the first opening. Next, in step S6, a first conductive layer is formed on the redistribution layer that is exposed through the first opening. Thereafter, in step S7, a conductive structure is arranged in the first opening, such that the conductive structure is in electrical contact with the first conductive layer.

In the following description, the respective steps of the aforementioned manufacturing method of the semiconductor structure will be described, and the silicon substrate 110 is used to represent a wafer which is not divided yet to form plural chips.

Figure 3:
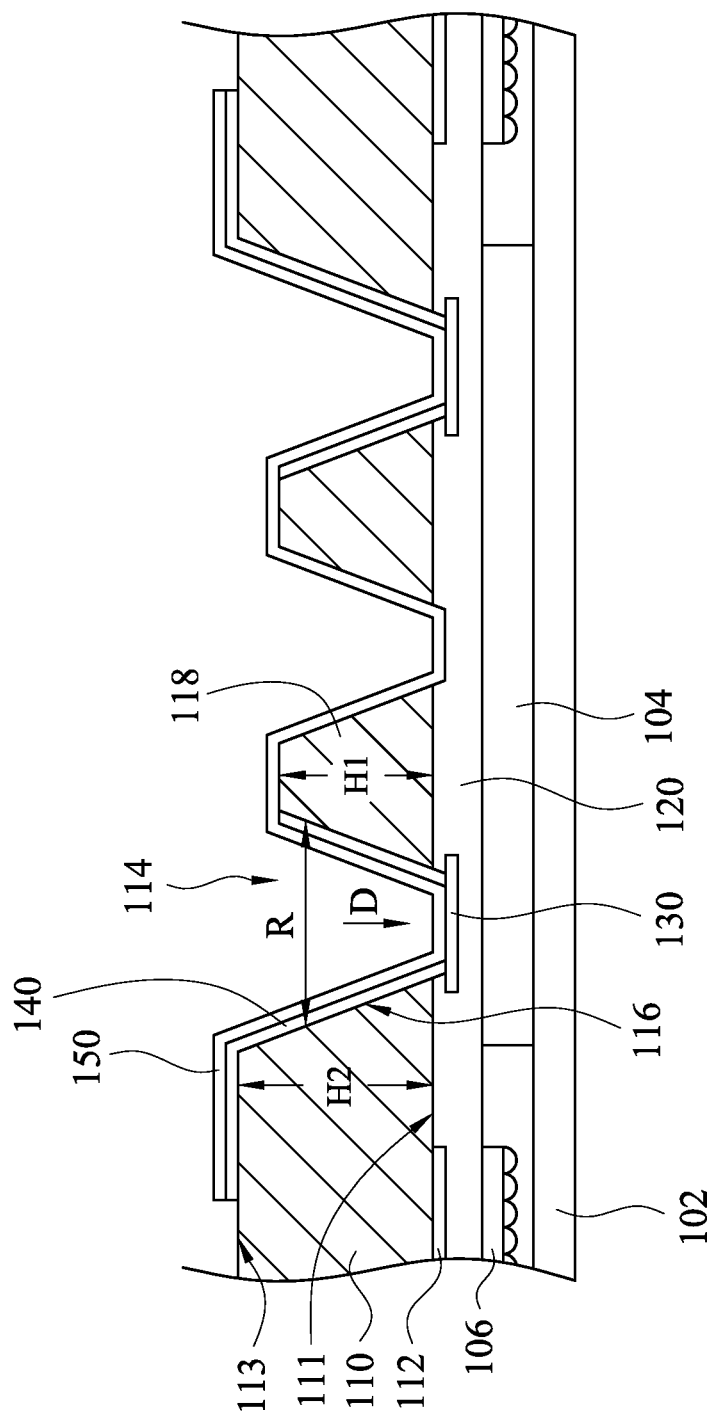
FIG. 3 is a cross-sectional view of an isolation layer and a redistribution layer after being formed on a silicon substrate shown in FIG. 2.

FIG. 3 is a cross-sectional view of the isolation layer 140 and the redistribution layer 150 after being formed on a silicon substrate 110 shown in FIG. 2. A wafer structure having the silicon substrate 110 and the protection layer 120 is provided. The electrical pad 130 on the protection layer 120 is exposed through the concave region 114 of the silicon substrate 110. An etching process may be performed on the silicon substrate 110 to form the concave region 114. In this embodiment, when the concave region 114 is formed, a tooth structure 118 may be formed in the silicon substrate 110, and the height H1 of the tooth structure 118 is smaller than or equal to the height H2 of the surface 113 of the silicon substrate 110. Thereafter, the isolation layer 140 may be formed on the sidewall 116 of the silicon substrate 110 surrounding the concave region 114 and the surface 113 of the silicon substrate 110 facing away from the protection layer 120. For example, the isolation layer 140 may be formed by utilizing a chemical vapor deposition (CVD) process, but the present invention is not limited in this regard. After forming the isolation layer 140, the redistribution layer 150 may be formed on the isolation layer 140 and the electrical pad 130.

In this embodiment, the diameter R of the concave region 114 is gradually increased toward the electrical pad 130 in a direction D, such that the sidewall 116 of the silicon substrate 110 is an oblique surface. As a result, the included angle between the sidewall 116 and the electrical pad 130 is an obtuse angle, so as to prevent the redistribution layer 150 on the connection position that is between the sidewall 116 and the electrical pad 130 from being broken.

Figure 4:
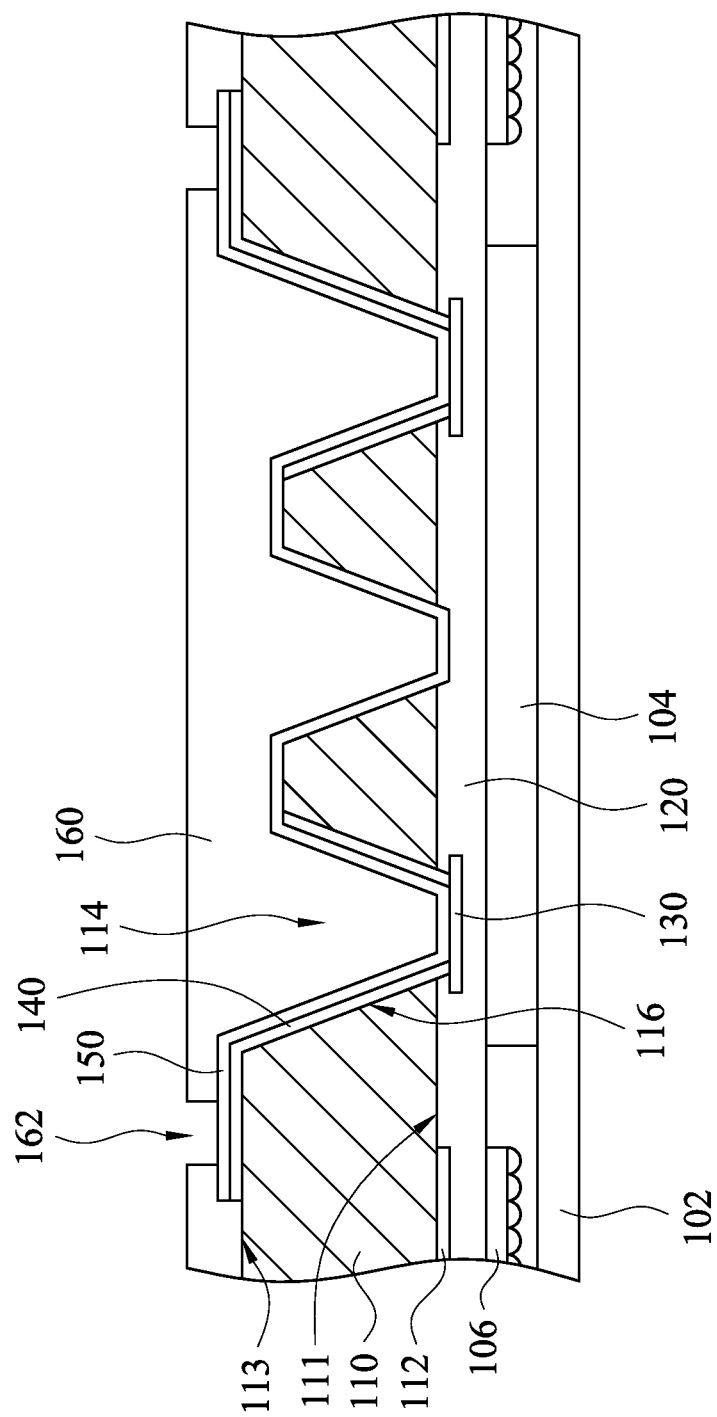
FIG. 4 is a cross-sectional view of a passivation layer after being formed on the redistribution layer shown in FIG. 3.

FIG. 4 is a cross-sectional view of the passivation layer 160 after being formed on the redistribution layer 150 shown in FIG. 3. As shown in FIG. 3 and FIG. 4, after the redistribution layer 150 is formed on the isolation layer 140 and the electrical pad 130, the passivation layer 160 may be formed on the redistribution layer 150 and cover the concave region 114. Thereafter, the passivation layer 160 may be patterned to form the first opening 162 therein, such that the redistribution layer 150 located on the surface 113 of the silicon substrate 110 is exposed through the first opening 162 of the passivation layer 160. The patterning process may be a photolithography technique including exposure, development, and etching processes.

Figure 5:
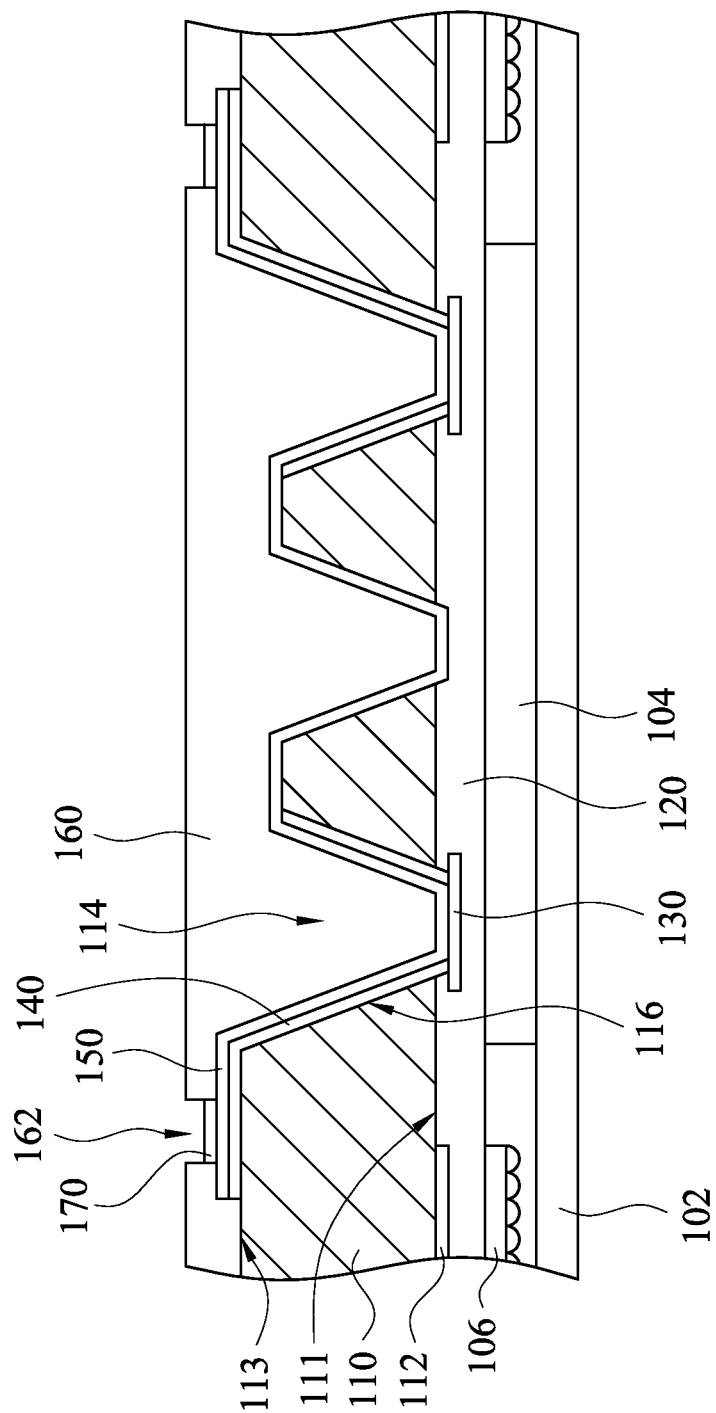
FIG. 5 is a cross-sectional view of a first conductive layer after being formed on the redistribution layer that is exposed through a first opening shown in FIG. 4.

FIG. 5 is a cross-sectional view of the first conductive layer 170 after being formed on the redistribution layer 150 that is exposed through the first opening 162 shown in FIG. 4. As shown in FIG. 4 and FIG. 5, after a portion of the redistribution layer 150 is exposed through the first opening 162 of the passivation layer 160, the first conductive layer 170 may be formed on the redistribution layer 150 that is exposed through the first opening 162. Since the redistribution layer 150 is made of metal (e.g., aluminum), the first conductive layer 170 may be formed on the redistribution layer 150 that is exposed through the first opening 162 by utilizing a chemical plating process. The first conductive layer 170 may be made of a material including nickel and gold. When the first conductive layer 170 is manufactured, the structure shown in FIG. 4 may be immersed in nickel solution, and subsequently immersed in gold solution, such that the first conductive layer 170 with nickel and gold can be formed on the redistribution layer 150 that is exposed through the first opening 162.

Figure 6:
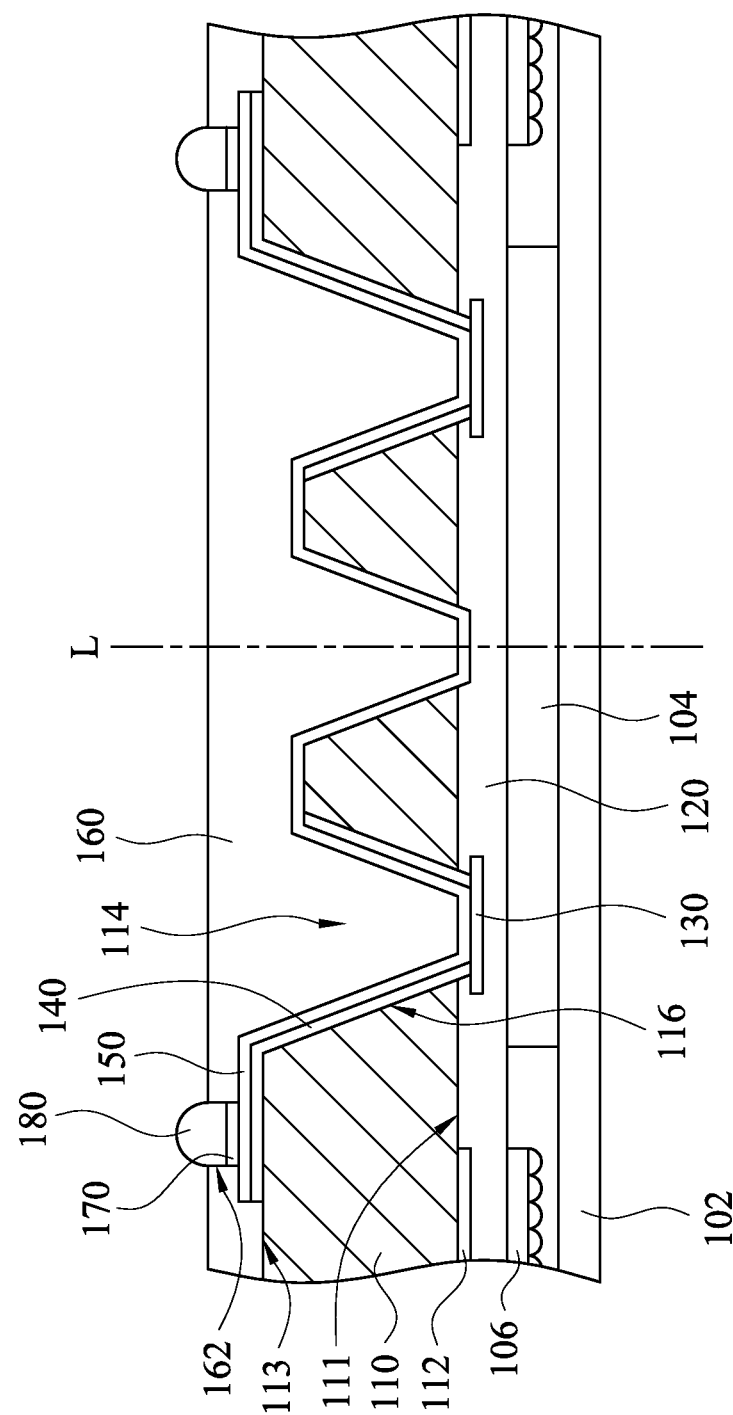
FIG. 6 is a cross-sectional view of a conductive structure after being disposed on the first conductive layer shown in FIG. 5.

FIG. 6 is a cross-sectional view of the conductive structure 180 after being disposed on the first conductive layer 170 shown in FIG. 5. As shown in FIG. 5 and FIG. 6, after the first conductive layer 170 is formed on the redistribution layer 150 that is exposed through the first opening 162, the conductive structure 180 may be arranged in the first opening 162 of the passivation layer 160, such that the conductive structure 180 may be in electrical contact with the first conductive layer 170. Thereafter, the passivation layer 160, the silicon substrate 110, the protection layer 120, the supporting layer 104, and the light transmissive element 102 may be divided along line L. As a result, the semiconductor structure 100a shown in FIG. 1 can be obtained.

Figure 7:
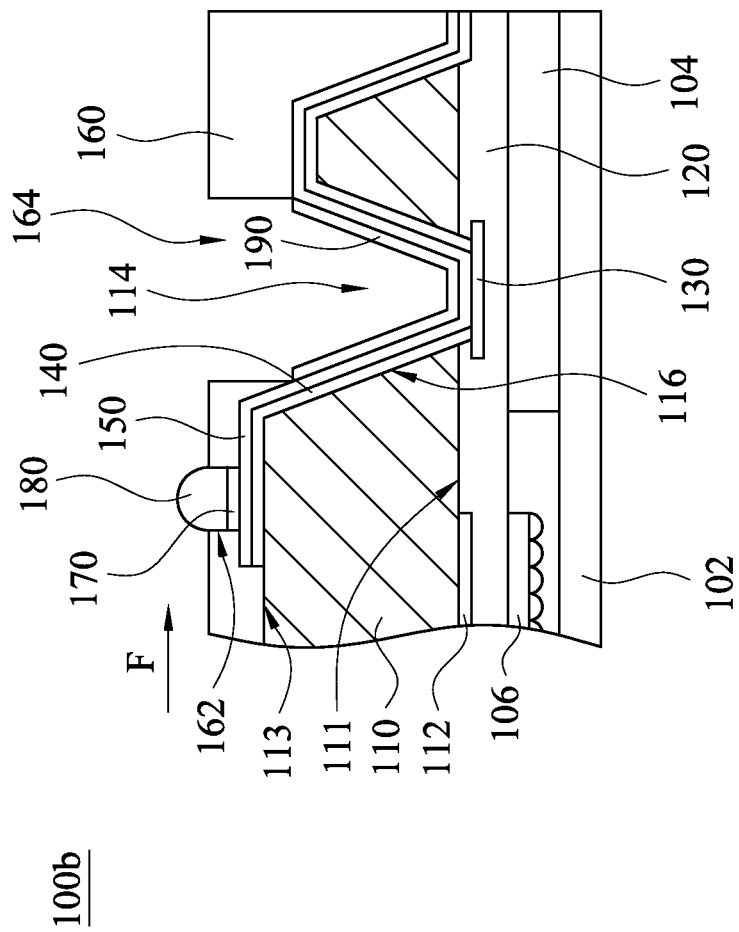
FIG. 7 is a cross-sectional view of a semiconductor structure according to one embodiment of the present invention.

FIG. 7 is a cross-sectional view of a semiconductor structure 100b according to one embodiment of the present invention. As shown in FIG. 7, the semiconductor structure 100b includes the silicon substrate 110, the protection layer 120, the electrical pad 130, the isolation layer 140, the redistribution layer 150, the passivation layer 160, the first conductive layer 170, and the conductive structure 180. The difference between this embodiment and the embodiment shown in FIG.

1 is that the passivation layer 160 has a second opening 164, and the redistribution layer 150 located on the electrical pad 130 and the sidewall 116 of the silicon substrate 110 is exposed through the second opening 164 of the passivation layer 160. Moreover, the semiconductor structure 100b further includes a second conductive layer 190. The second conductive layer 190 is located on the redistribution layer 150 that is exposed through the second opening 164.

In this embodiment, the perpendicular height of the second conductive layer 190 is smaller than the perpendicular height of the surface 113 of the silicon substrate 110 facing away from the protection layer 120. That is to say, the second conductive layer 190 is under the surface 113 of the silicon substrate 110.

It is to be noted that the connection relationships of the elements described above will not be repeated in the following description. In the following description, the manufacturing method of the semiconductor structure 100b will be described.

Figure 8:
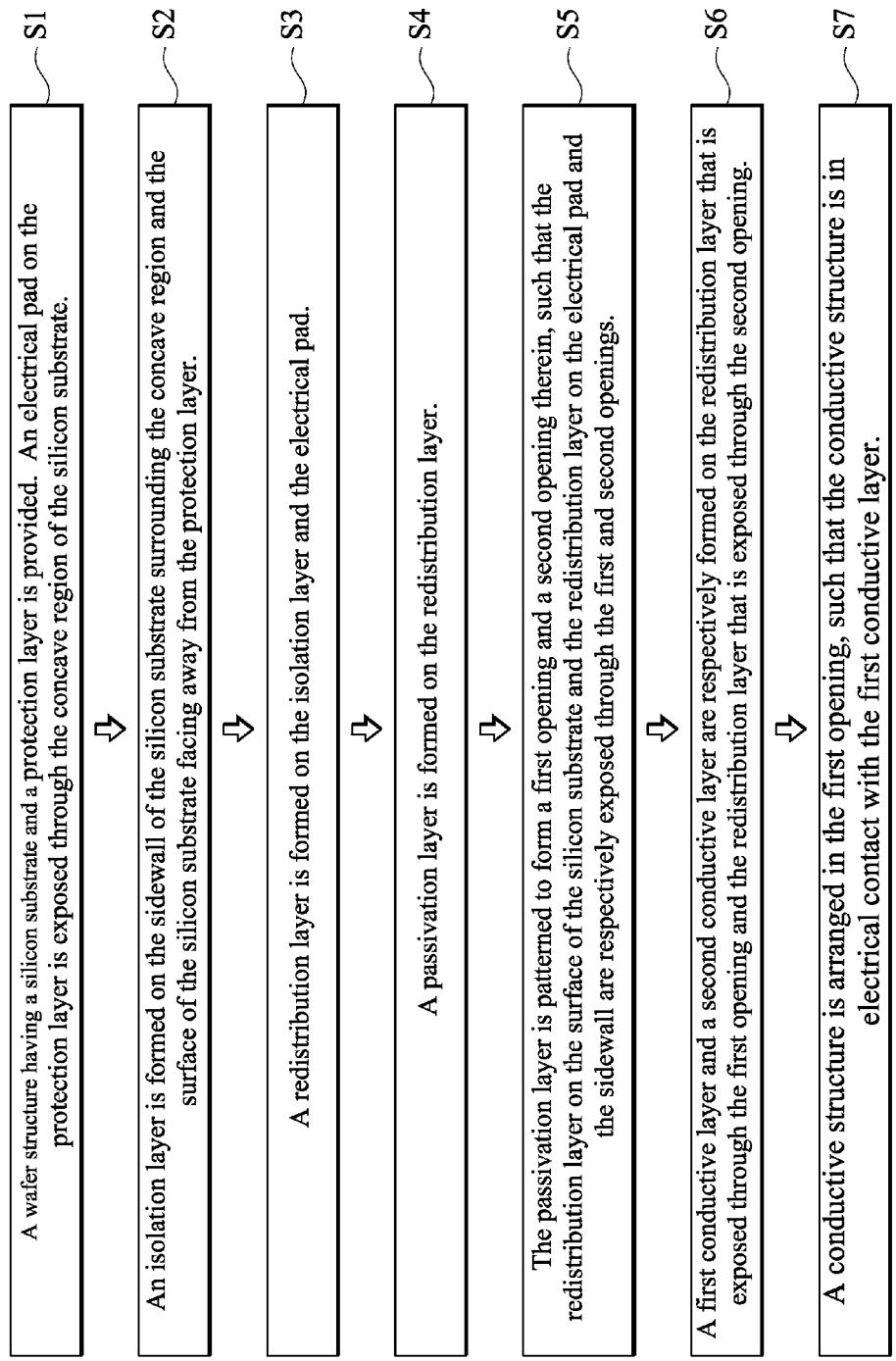
FIG. 8 is a flow chart of a manufacturing method of a semiconductor structure according to one embodiment of the present invention.

FIG. 8 is a flow chart of a manufacturing method of a semiconductor structure according to one embodiment of the present invention. In step S1, a wafer structure having a silicon substrate and a protection layer is provided. An electrical pad on the protection layer is exposed through the concave region of the silicon substrate. Thereafter, in step S2, an isolation layer is formed on the sidewall of the silicon substrate surrounding the concave region and the surface of the silicon substrate facing away from the protection layer. Next, in step S3, a redistribution layer is formed on the isolation layer and the electrical pad. Then, in step S4, a passivation layer is formed on the redistribution layer. Thereafter in step S5, the passivation layer is patterned to form a first opening and a second opening therein, such that the redistribution layer on the surface of the silicon substrate and the redistribution layer on the electrical pad and the sidewall are respectively exposed through the first and second openings. Next, in step S6, a first conductive layer and a second conductive layer are respectively formed on the redistribution layer that is exposed through the first opening and the redistribution layer that is exposed through the second opening. Thereafter, in step S7, a conductive structure is arranged in the first opening, such that the conductive structure is in electrical contact with the first conductive layer.

In the following description, the aforementioned manufacturing method of the semiconductor structure will be described, and a silicon substrate 110 is referred to as a wafer which is not divided yet to form plural chips.

The structure shown in FIG. 3 is provided, and the electrical pad 130 on the protection layer 120 is exposed through the concave region 114 of the silicon substrate 110. The isolation layer 140 is formed on the sidewall 116 of the silicon substrate 110 surrounding the concave region 114 and the surface 113 of the silicon substrate 110 facing away from the protection layer 120. The redistribution layer 150 is formed on the isolation layer 140 and the electrical pad 130.

Figure 9:
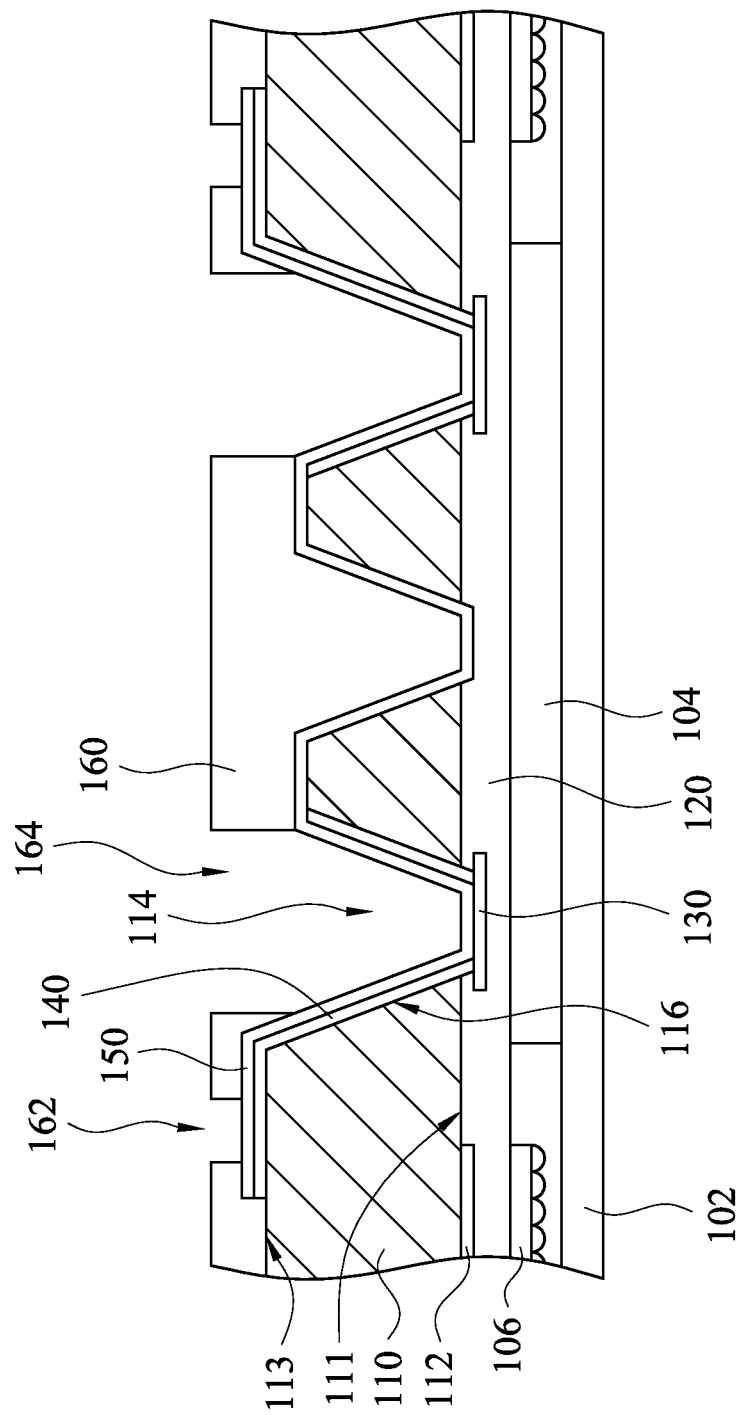
FIG. 9 is a cross-sectional view of a passivation layer after being formed on a redistribution layer shown in FIG. 8.

FIG. 9 is a cross-sectional view of the passivation layer 160 after being formed on the redistribution layer 150 shown in FIG. 8. After the redistribution layer 150 is formed on the isolation layer 140 and the electrical pad 130, the passivation layer 160 may be formed on the redistribution layer 150 and cover the concave region 114. Thereafter, the passivation layer 160 may be patterned to form the first opening 162 and the second opening 164 therein, such that the redistribution layer 150 on the surface 113 of the silicon substrate 110 is exposed through the first opening 162 of the passivation layer 160, and the redistribution layer 150 located on the electrical pad 130 and the sidewall 116 is exposed through the second opening 164 of the passivation layer 160.

Figure 10:
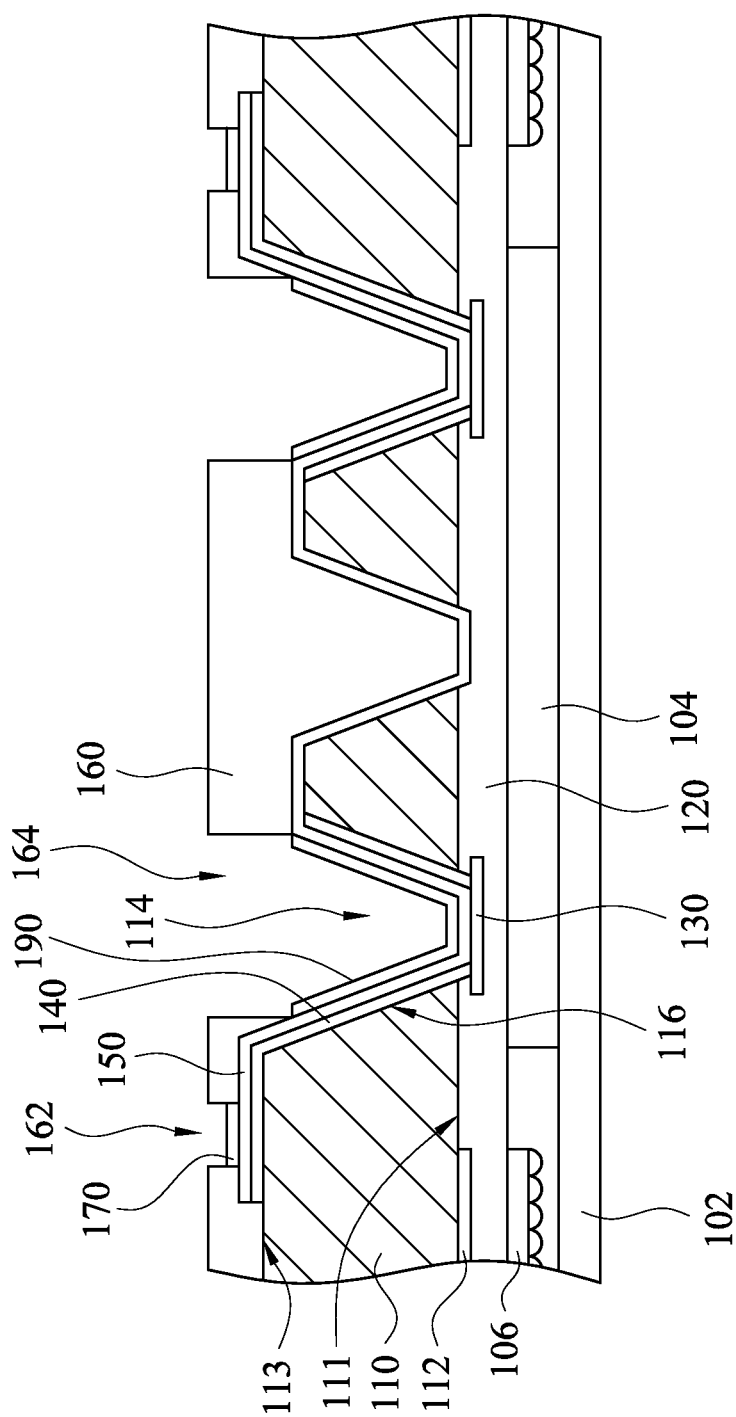
FIG. 10 is a cross-sectional view of a first conductive layer and a second conductive layer after being respectively formed on the redistribution layer exposed through a first opening and a second opening shown in FIG. 9.

FIG. 10 is a cross-sectional view of the first conductive layer 170 and the second conductive layer 190 after being respectively formed on the redistribution layer 150 that is exposed through the first and second openings 162, 164 shown in FIG. 9. As shown in FIG. 9 and FIG. 10, after the redistribution layer 150 is exposed through the first and second openings 162, 164 of the passivation layer 160, the first conductive layer 170 may be formed on the redistribution layer 150 that is exposed through the first opening 162, and the second conductive layer 190 may be formed on the redistribution layer 150 that is exposed through the second opening 164. Since the redistribution layer 150 is made of metal (e.g., aluminum), the first conductive layer 170 and the second conductive layer 190 may be respectively formed on the redistribution layer 150 that is exposed through the first opening 162, and the redistribution layer 150 that is exposed through the second opening 164 by utilizing a chemical plating process. When the first and second conductive layers 170, 190 are manufactured, the structure shown in FIG. 9 may be immersed in nickel solution, and then immersed in gold solution, such that the first conductive layer 170 with nickel and gold can be formed on the redistribution layer 150 that is exposed through the first opening 162, and the second conductive layer 190 with nickel and gold may be formed on the redistribution layer 150 that is exposed through the second opening 164.

Figure 11:
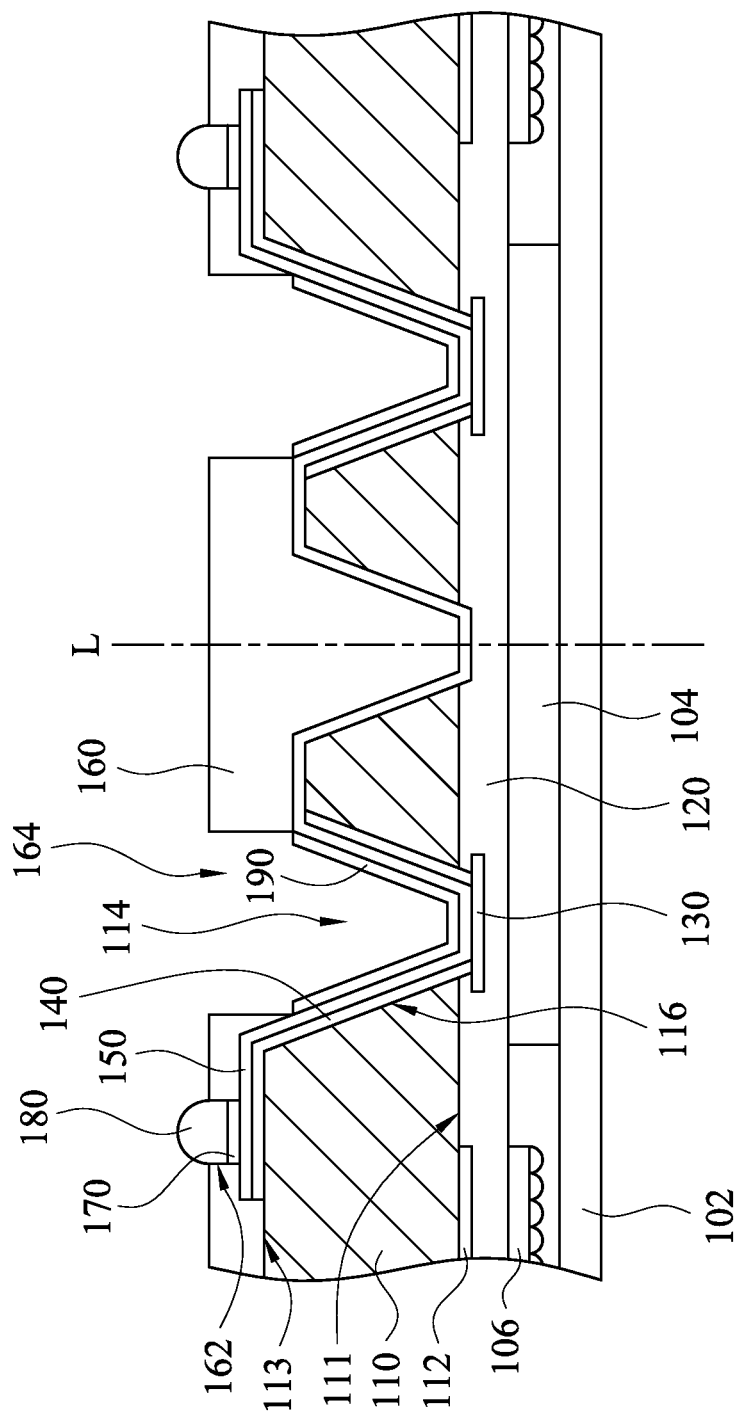
FIG. 11 is a cross-sectional view of a conductive structure after being disposed on the first conductive layer shown in FIG. 10.

FIG. 11 is a cross-sectional view of the conductive structure 180 after being disposed on the first conductive layer 170 shown in FIG. 10. As shown in FIG. 10 and FIG. 11, after the first conductive layers 170 and the second conductive layer 190 are respectively formed on the redistribution layer 150 that is exposed through the first opening 162, and the redistribution layer 150 that is exposed through the second opening 164, the conductive structure 180 may be arranged in the first opening 162 of the passivation layer 160, such that the conductive structure 180 is in electrical contact with the first conductive layer 170. Thereafter, the passivation layer 160, the silicon substrate 110, the protection layer 120, the supporting layer 104, and the light transmissive element 102 may be divided along line L. As a result, the semiconductor structure 100b shown in FIG. 7 can be obtained.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A manufacturing method of a semiconductor structure, the manufacturing method comprising:
   (a) providing a wafer structure having a silicon substrate and a protection layer, wherein an electrical pad on the protection layer is exposed through a concave region of the silicon substrate;
   (b) forming an isolation layer on a sidewall of the silicon substrate surrounding the concave region and a surface of the silicon substrate facing away from the protection layer;

(c) forming a redistribution layer on the isolation layer and the electrical pad;

(d) forming a passivation layer on the redistribution layer;

(e) patterning the passivation layer to form a first opening and a second opening therein, thereby exposing the redistribution layer on the surface of the silicon substrate through the first opening and exposing the redistribution layer on the electrical pad and the sidewall through the second opening;

(f) forming a first conductive layer on the redistribution layer that is exposed through the first opening and a second conductive layer on the redistribution layer that is exposed through the second opening; and (g) arranging a conductive structure in the first opening, thereby enabling the conductive structure to electrically contact the first conductive layer.

2. The manufacturing method of claim 1, wherein the first conductive layer in step (f) is formed by utilizing a chemical plating process.

3. The manufacturing method of claim 1, wherein the isolation layer in step (b) is formed by utilizing a chemical vapor deposition process.

4. The manufacturing method of claim 1, wherein the wafer structure has a light transmissive element and a supporting layer that is located between the light transmissive element and the protection layer, and the manufacturing method further comprises:

cutting the passivation layer, the silicon substrate, the protection layer, the supporting layer, and the light transmissive element.

5. The manufacturing method of claim 1, further comprising:

forming a tooth structure in the silicon substrate, wherein a height of the tooth structure is smaller than or equal to a height of the surface of the silicon substrate.

6. The manufacturing method of claim 1, wherein the first conductive layer is made of a material including nickel and gold.

7. A semiconductor structure, comprising:

a silicon substrate having a light sensor and a concave region;

a protection layer located on the silicon substrate and covering the light sensor;

an electrical pad located on the protection layer and aligned with the concave region;

an isolation layer located on a sidewall of the silicon substrate surrounding the concave region and a surface of the silicon substrate facing away from the protection layer;

a redistribution layer located on the isolation layer and the electrical pad;

a passivation layer located on the redistribution layer and having a first opening and a second opening, wherein the redistribution layer is located on the electrical pad and the sidewall of the silicon substrate is exposed through the second opening;

a first conductive layer located on the redistribution layer that is exposed through the first opening;

a second conductive layer located on the redistribution layer that is exposed through the second opening; and a conductive structure located in the first opening and in electrical contact with the first conductive layer.

8. The semiconductor structure of claim 7, wherein a perpendicular height of the second conductive layer is smaller than a perpendicular height of the surface of the silicon substrate.

9. The semiconductor structure of claim 7, wherein a diameter of the concave region is gradually increased toward the electrical pad, such that the sidewall of the silicon substrate is an oblique surface.

10. The semiconductor structure of claim 7, wherein the isolation layer is made of a material comprising oxide or nitride.

11. The semiconductor structure of claim 7, further comprising:

a light transmissive element; and a supporting layer between the light transmissive element and the protection layer.

12. The semiconductor structure of claim 7, wherein the silicon substrate further comprises:

a tooth structure adjacent to the concave region, wherein a height of the tooth structure is smaller than or equal to a height of the surface of the silicon substrate, and a top end of the tooth structure is cusp-shaped, round-shaped, or flat-shaped.

13. The semiconductor structure of claim 7, wherein the conductive structure is a solder ball or a conductive protruding block.

14. The semiconductor structure of claim 7, wherein the first conductive layer is made of a material including nickel and gold.

* * * * *